US009903532B2

(12) United States Patent
Kovacs et al.

(10) Patent No.: US 9,903,532 B2
(45) Date of Patent: Feb. 27, 2018

(54) CLAMP ASSEMBLY USING PINS

(71) Applicant: PMC Industries, Inc., Plainville, CT (US)

(72) Inventors: Tamas Kovacs, Burlington, CT (US); Alan Wasley, Southington, CT (US); Jim Bailey, Old Saybrook, CT (US); Martin Taylor, Terryville, CT (US)

(73) Assignee: PMC Industries, Inc., Plainville, CT (US)

( * ) Notice: Subject to any disclaimer, the term of this patent is extended or adjusted under 35 U.S.C. 154(b) by 0 days.

(21) Appl. No.: 15/414,616

(22) Filed: Jan. 24, 2017

(65) Prior Publication Data

US 2017/0130894 A1 May 11, 2017

Related U.S. Application Data

(63) Continuation of application No. 14/443,567, filed as application No. PCT/US2014/046242 on Jul. 10, 2014.

(Continued)

(51) Int. Cl.
F16M 13/02 (2006.01)
F24J 2/52 (2006.01)
(Continued)

(52) U.S. Cl.
CPC ........... *F16M 13/022* (2013.01); *B25B 5/003* (2013.01); *B25B 5/101* (2013.01); *F16B 2/065* (2013.01); *F16B 5/0072* (2013.01); *F24J 2/5249* (2013.01)

(58) Field of Classification Search
CPC .... B25B 1/00; B25B 3/00; B25B 5/00; B25B 7/00
(Continued)

(56) References Cited

U.S. PATENT DOCUMENTS 4,936,005 A * 6/1990 Dziurowitz ............... B23P 6/00
29/402.04
5,715,640 A 2/1998 Haddock
(Continued)

FOREIGN PATENT DOCUMENTS

DE 2536555 A1 3/1976
EP 2339087 A1 6/2011
(Continued)

Primary Examiner — Lee D Wilson
(74) Attorney, Agent, or Firm — Damian Wasserbauer Esq.; Wasserbauer Law LLC

(57) ABSTRACT

A clamp assembly that may be used for securing to a raised portion of a surface. The clamp assembly comprising a mounting body of a general block shape having a slot for receiving the raised portion formed in a bottom surface of the mounting body attaching the clamp assembly thereto. The clamp assembly is configured with one or more pins that may be formed in a substantially elongated cylindrical shape. The pins may be configured to be received in one or more push-pin holes formed in the mounting body, whereby the push-pin holes extend to the slot from a side surface of push-pin holes. The clamp assembly includes a fastening element adapted to be received in a fastener hole formed adjacent the push-pin holes in the side surface of the mounting body. The fastening element is configured to secure, attach and hold the clamp assembly to the standing seam by forcing the pins against the raised portion of the surface disposed in the slot.

19 Claims, 6 Drawing Sheets

Related U.S. Application Data

(60) Provisional application No. 61/844,763, filed on Jul. 10, 2013.

(51) Int. Cl.
*B25B 5/00* (2006.01)
*B25B 5/10* (2006.01)
*F16B 2/06* (2006.01)
*F16B 5/00* (2006.01)

(58) Field of Classification Search
USPC .......................................................... 269/296
See application file for complete search history.

(56) References Cited

U.S. PATENT DOCUMENTS

| | | | |
|---|---|---|---|
| 6,688,047 B1 | 2/2004 | McNichol | |
| 7,000,519 B1* | 2/2006 | Weinstein | B25B 5/003 144/287 |
| 7,127,852 B1* | 10/2006 | Dressler | E04D 13/10 248/224.51 |
| 7,386,922 B1 | 6/2008 | Taylor et al. | |
| 7,703,256 B2* | 4/2010 | Haddock | F16B 2/10 52/24 |
| 8,505,864 B1 | 8/2013 | Taylor et al. | |
| 8,732,917 B2* | 5/2014 | Zeilenga | F24J 2/5249 24/514 |
| 8,898,961 B1 | 12/2014 | Cline | |
| 8,910,928 B2* | 12/2014 | Header | E04D 13/10 269/91 |
| 9,145,685 B2* | 9/2015 | Stapleton | E04D 13/00 |
| 2002/0088196 A1* | 7/2002 | Haddock | E04D 3/3608 52/543 |
| 2005/0102958 A1* | 5/2005 | Anderson | E04D 13/10 52/698 |
| 2008/0302928 A1* | 12/2008 | Haddock | E04F 13/0821 248/205.1 |
| 2012/0180406 A1 | 7/2012 | Kobayashi | |
| 2012/0299233 A1* | 11/2012 | Header | E04D 13/10 269/91 |
| 2013/0145711 A1* | 6/2013 | Haddock | E04F 13/0821 52/478 |
| 2013/0168525 A1 | 7/2013 | Haddock | |
| 2014/0341645 A1* | 11/2014 | Liu | F16B 2/065 403/311 |
| 2016/0177984 A1 | 6/2016 | Kovacs et al. | |

FOREIGN PATENT DOCUMENTS

| | | |
|---|---|---|
| FR | 1562347 A | 4/1969 |
| KR | 101036955 B1 | 5/2011 |
| WO | 2013055900 A3 | 6/2013 |

* cited by examiner

US 9,903,532 B2

CLAMP ASSEMBLY USING PINS

CROSS REFERENCE TO RELATED APPLICATIONS

This patent application claims priority to U.S. Non-provisional patent application Ser. No. 14/443,567 filed May 18, 2015, a 371 national phase of PCT/US2014/046242 filed Jul. 10, 2014, that claims benefit of Provisional Patent Application Ser. No. 61/844,763, entitled "CLAMP FOR STANDING SEAM" filed on Jul. 10, 2013, and the entire disclosure is hereby incorporated by reference herein.

FIELD OF THE INVENTION

The present invention is in the field of mounting assemblies for a standing seam of a roof panel and, in particular, to a mounting assembly with a non-penetrating clamp for securely locking pins into the roof panel without damaging the panel's surface, with the clamp configuration providing an improved hold that resists loosening from environmental conditions, high wind, seismic vibration, and snow loads. The clamp further features an integral groove for grounding wires, cables and securing other things.

BACKGROUND OF THE INVENTION

Conventional metal roof systems require attachment systems in order to attach panels, solar panels, snow rails, wind clamps, signs, HVAC equipment, conduit and the like to a standing seam of a metal roof. A metal roof is a series of panels or tiles configured to be joined to a sub-layer by fasteners and to form a weather seal by overlapping these tiles or panels in a known way. The metal panels or tiles can be copper, aluminum, zinc coated steel, stainless steel, or other composite blend of metals. Elongated panels can be arranged longitudinally across a roof—from ridge line to overhang—overlapped and joined in a raised, standing seam.

Conventional systems need to need to secure, hold and maintain devices and things to a metal roof standing seam under normal thermal and vibration activity. In such applications a variety of systems and clamps have been developed to attach the device to the raised seam such as, for example, solar panels, satellite dishes, antennae, and other things e.g. footholds, guides, snow breaks, structures or general supports. These attached devices and things are constantly affected by thermal movement and vibration actions.

Thermal movement of the attachment system occurs as the metal of a roof is heated and cooled by the sun, and under snow loads. For example, threaded fasteners in clamps can loosen by the expanding and contracting to the point that the clamp can slide along the standing seam. As a result, there is a need in the art for an improvements in holding clamps on a standing seam that overcomes the problem of thermal movement.

Another condition that loosens clamps is vibration. For example, fasteners can torque, back-out, or otherwise loosen a clamp secured to the standing roof from high winds and seismic vibration, e.g. traffic, normal earth vibration, earthquakes and the like. Some manufacturers recommend retightening clamps periodically, which is a disadvantage as requiring ongoing maintenance and cost. Recently, standards have been issued for seismic vibrations and activity and known clamp assemblies have yet to be able to meet these seismic standards. As a result, there is a need in the art for an improvement in holding clamps on a standing seam that overcomes the problems of loosening from vibration and other factors.

Other problems and disadvantages with conventional clamps and mounting systems involve not gouging or deforming the applied surface of the metal roof. Metal roofs are provided in color choices and in a variety of coatings that enhance a building appearance and can last decades. The coatings are not only aesthetically pleasing but can function in certain ways from ice and dirt resistance because of non-stick coatings to being energy efficient. It is desirable that the installation process does not scratch, bend, ding or otherwise compromise the top coat of paint, powder coat, Teflon®, or the like. If the top coating is compromised problems occur such as, for example, leakage, limiting the life of the roof from degradation, oxidation, taking away from the appearance, and voiding a manufacturer's warranty. As a result, there is a need in the art for an improved non-penetrating clamp for securely locking pins into the standing seam and roof panel without damaging the panel's surface.

SUMMARY OF THE INVENTION

The present invention is embodied by a clamp assembly, and a mounting assembly, that may be used for securing a device (e.g. a solar panel, Roof Mounted Displays, Satellite Dishes, Conduit and Piping, Snow-Retention System, HVAC, structures, things, etc.) to a raised portion of a standing seam of a metal roof, panel or tile of a building surface. The clamp assembly comprising a mounting body of a general block shape having a slot for receiving the standing seam formed in a bottom surface of the mounting body and an attachment hole in upper and side surfaces for securing thereon and attaching the device thereto. The clamp assembly is configured with one or more pins that may be formed in a substantially elongated cylindrical shape. The pins may be configured to be received in one or more push-pin holes formed in the mounting body, whereby the push-pin holes extend to the slot from a side surface of push-pin holes. The clamp assembly includes a fastening element adapted to be received in a fastener hole formed adjacent the push-pin holes in the side surface of the mounting body. The fastening element is configured to secure, attach, hold and maintain the clamp assembly to the standing seam by forcing the pins against the standing seam disposed in the slot. The clamp assembly further comprises a groove adapted to receive and secure a ground wire, cable and/or other item advantageous for grounding of electrical components and organization.

The present invention is embodied by a mounting assembly and/or kit that may be used for securing a device to a raised portion of a standing seam of a surface. The mounting assembly comprising a clamp assembly formed with a mounting body of a general block shape, one or more pins with each of the pins having a substantially elongated cylindrical shape and configured to be received in one or more push-pin holes formed in the mounting body, whereby the holes extend substantially orthogonal relative to the slot from a side surface of the mounting body. The clamp assembly includes a fastening element adapted to be received in a fastener hole formed adjacent the push-pin holes and configured to secure, attach, hold, and maintain the clamp assembly the standing seam by forcing the pins against the raised portion of the standing seam when it is disposed in the slot. The mounting assembly further comprising a panel fastening assembly with a device fastening element adapted to be received in an attachment hole disposed on an upper surface of the mounting body for securing the device, one or more one or more solar caps adapted to be disposed on the device fastening element so as to mount and secure the device with the device between said solar caps by tightening said device fastening element.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Description of the Embodiments, which is to be read in association with the accompanying drawings, which are incorporated in and constitute a part of this specification, show certain aspects of the subject matter disclosed herein and, together with the description, help explain some of the principles associated with the disclosed implementations, wherein.

DESCRIPTION OF THE EMBODIMENTS

Figure 1:
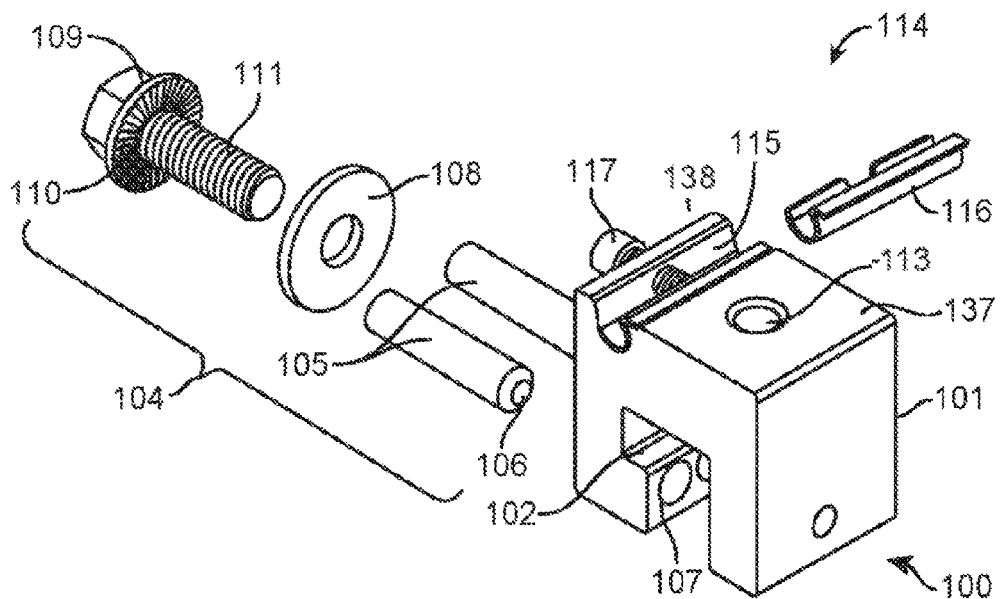
FIG. 1 illustrates the clamp in accordance with an embodiment of the present invention.
Figure 2:
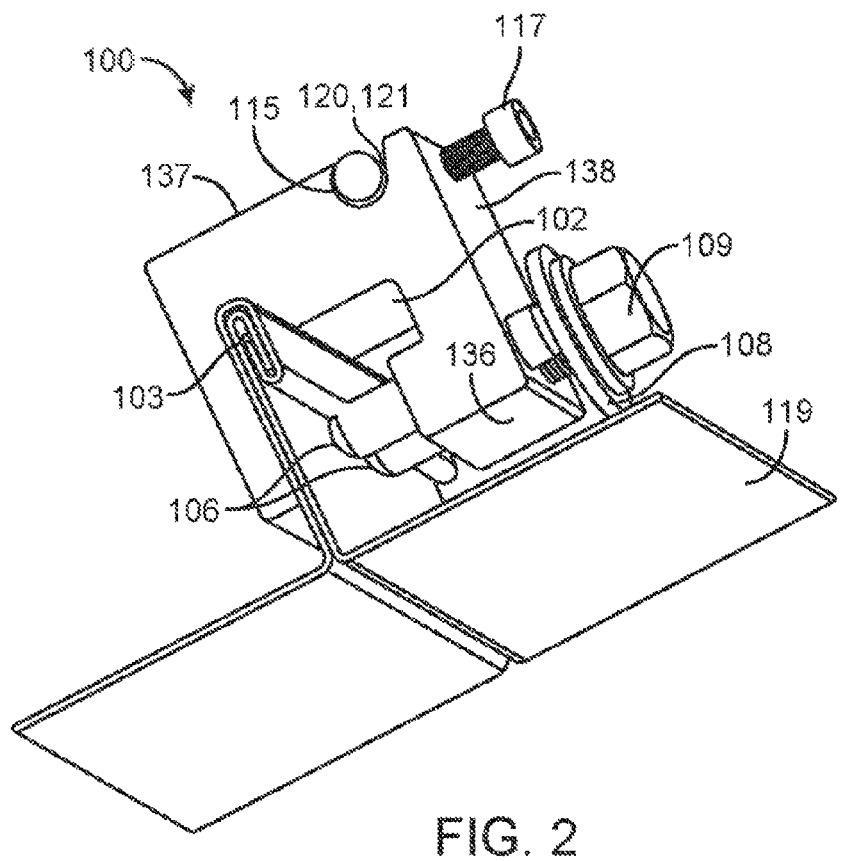
FIG. 2 illustrates the clamp secured to a metal roof standing seam in accordance with an embodiment of the present invention.

Non-limiting embodiments of the present invention will be described below with reference to the accompanying drawings, wherein like reference numerals represent like elements throughout. While the invention has been described in detail with respect to the preferred embodiments thereof, it will be appreciated that upon reading and understanding of the foregoing, certain variations to the preferred embodiments will become apparent, which variations are nonetheless within the spirit and scope of the invention.

The terms "a" or "an", as used herein, are defined as one or as more than one. The term "plurality", as used herein, is defined as two or as more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "some embodiments", "one embodiment", "certain embodiments", and "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means any of the following: "A; B; C; A and B; A and C; B and C; A, B and C". An exception to this definition will occur only when a combination of elements, functions, steps or acts are in some way inherently mutually exclusive.

The drawings featured in the figures are provided for the purposes of illustrating some embodiments of the present invention, and are not to be considered as limitation thereto. Term "means" preceding a present participle of an operation indicates a desired function for which there is one or more embodiments, i.e., one or more methods, devices, or apparatuses for achieving the desired function and that one skilled in the art could select from these or their equivalent in view of the disclosure herein and use of the term "means" is not intended to be limiting.

As used herein the term "fastening element" refers to refers to a type of fastener with threads such as, for example, threaded screw, bolt with a head of predetermined length and dimension such that the bolt with a head able to be tightened (e.g. by a wrench), or nut-bolt assembly. According to an embodiment of the present invention, the device fastening element is selected from the group consisting of a bolt, threaded bolt, screw, set-screw, self-tapping screw, double ended screw, dowel screw, hanger bolt, nut-and-bolt, or security head screw As used herein the term "washer" refers to a thin plate (typically disk-shaped) with a hole (typically in the middle) that is normally used to distribute the load of a threaded fastening element, such as a screw or nut. According to an embodiment of the present invention, the washers can be plain washers functioning to distribute the load, spring washers functioning to have axial flexibility and to prevent fastening loosening due to vibrations and locking washers functioning to prevent fastening loosening by preventing unscrewing rotation of the fastening device.

As used herein the term "set screw" or "second fastening element" refers to a type of fastener such as, for example, a screw or bolt generally used to secure an object within or against another object. According to an embodiment of the present invention, second fastening element is selected from the group consisting of a screw, set-screw, self-tapping screw, stable or nail that exerts compression or a clamping force on ground wire, cable or other item in the groove to hold and secure it in place.

As used herein the term "third fastening element" or "device fastening element" refers to a type of fastener such as, for example, a nut 129 and threaded screw or bolt 139 having a hex head cap, or threaded screw or bolt with a head 139a of predetermined length and dimension such that the bolt with a head able to be tightened (e.g. by a wrench) replaces nut 129. According to an embodiment of the present invention, the device fastening element is selected from the group consisting of a bolt, threaded bolt, screw, set-screw, self-tapping screw, double ended screw, dowel screw, hanger bolt, nut-and-bolt, or security head screw.

Figure 5:
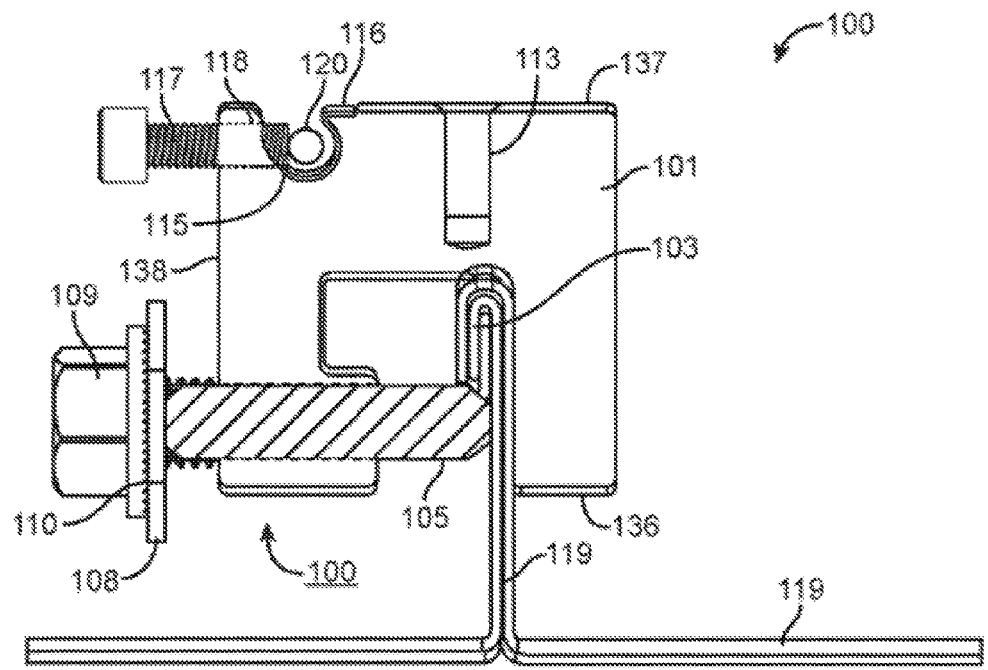
FIG. 5 illustrates a side view in the closed position of the clamp along line A-A of FIG. 8.
Figure 6:
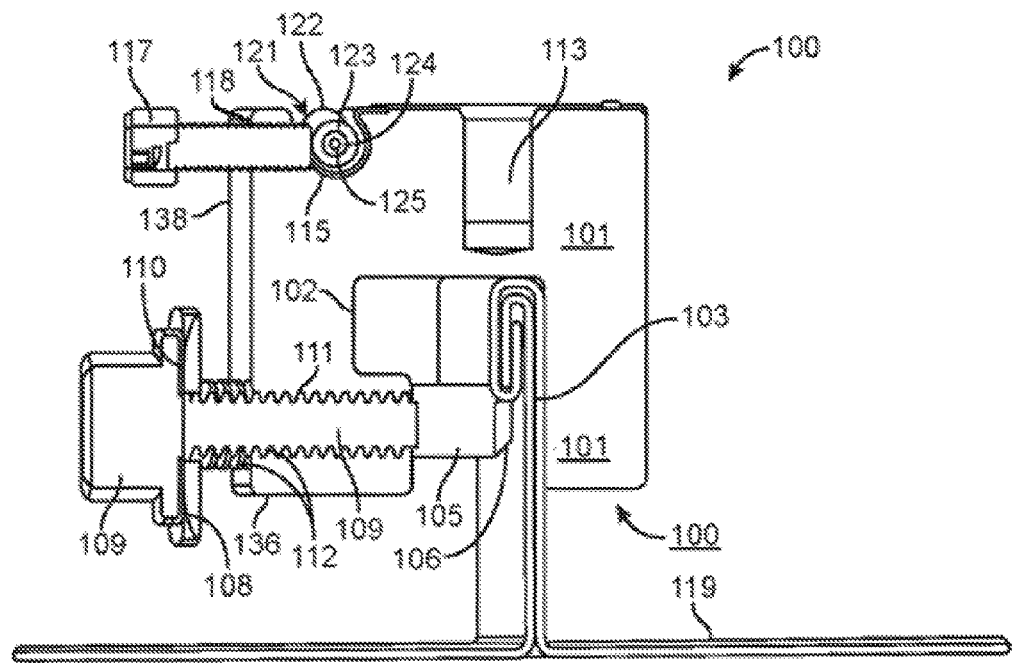
FIG. 6 illustrates a side view in the closed position of the clamp along lines B-B of FIG. 8.

As is illustrated in FIGS. 1-9, 10 (prior art), and 11-16, an embodiment of a clamp assembly 100, and a mounting assembly 150, according to the present invention is described. In particular, as shown in FIG. 1, the clamp assembly 100 comprises a mounting block or body 101 with a slot 102 adapted to receive a standing or raised seam 103 of a metal roof 119 so as to be secured thereto by a fastener assembly 104. The fastener assembly 104 comprises one or more pins or push-pins 105 with tapered ends 106 adapted to be received in one or more push-pins holes 107 in the mounting body 101, a washer 108, and a fastening element 109 having a locking portion 110. The push-pin holes 107 are formed between a side surface 138 of the mounting body 101 and the slot 102, extending from the side surface 138 through the mounting body 101 and substantially orthogonal to the slot 102. As shown in FIG. 5, the push-pin holes 107 may be formed smooth so as to allow movement of the pins 105 freely in and along push-pin holes 107 therein. The push-pin holes 107 for the pins 105 are disposed adjacent the fastener hole 111 such that, in operation, tightening the fastening element 109 urges the pins 105 toward the standing seam 103 to secure the clamp assembly 100 thereto. As shown in FIG. 6, the fastening element 109 is adapted to be received in fastener hole 113 having a threaded portion 112 to engage the threads 112 of fastening element 109 adjacent the push-pin holes 107 as is shown in FIG. 6.

Figure 13:
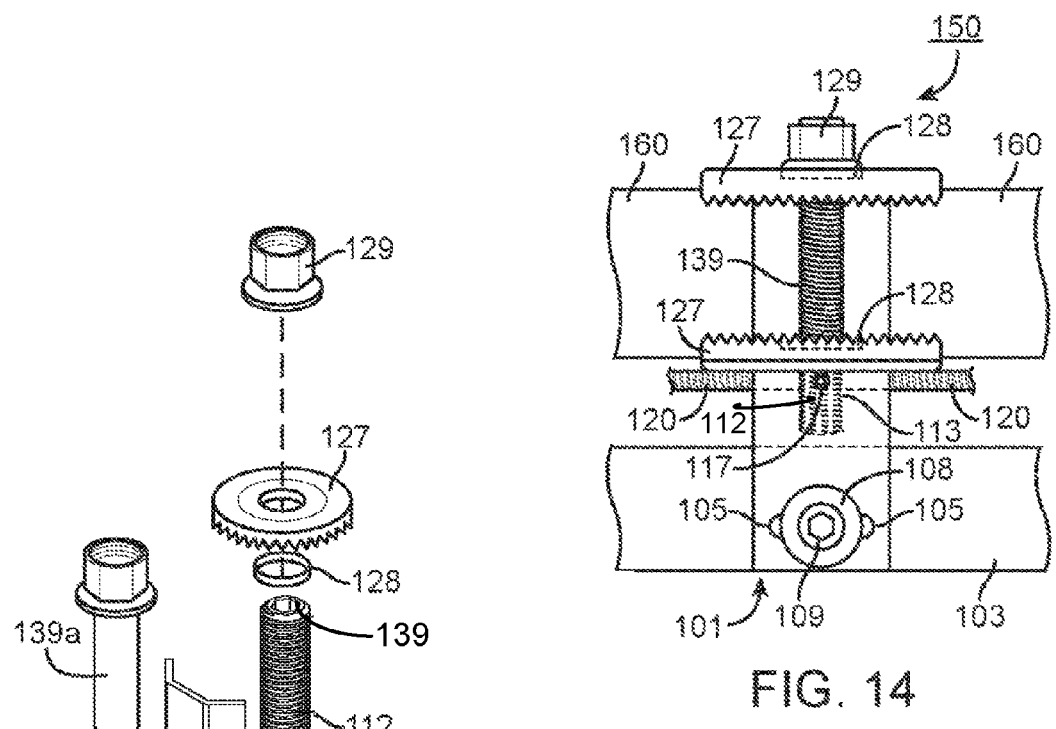
FIG. 13 illustrates an exploded view of a mounting assembly and kit according to an embodiment of the present invention.
Figure 14:
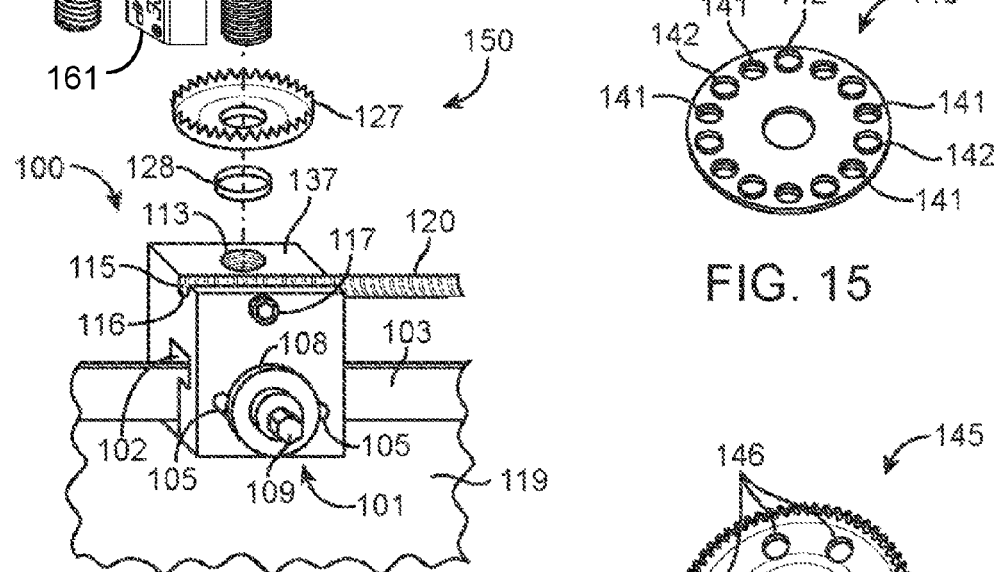
FIG. 14 illustrates a schematic view of a mounting assembly and kit according to an embodiment of the present invention.

The mounting body 101 can further have an attachment hole 113 for securing a device and assemblies thereto such as, for example, a solar panel. The attachment hole 113 may be formed threaded with threads 112 to accept the threads 112 of a post of the panel fastener assembly 126 as is shown in FIGS. 13 and 14. Alternatively, attachment hole 113 may be formed smooth for a self-tapping fastening element 139a (e.g. bolt, screw, etc.) to attach and the device 160 to the mounting body 101. As is illustrated in FIG. 1, The clamp assembly 100 can be configured with a wire assembly 114 configured with a groove 115 formed in the mounting body 101 adapted to receive a ground wire 120, or to receive in groove 115 electrical cables 121 and other items with or without the sleeve 106 thereto. The groove 115 can adapted to receive a sleeve 116 so as to insulate the ground wire 120 from the mounting body 101 and to sleeve 116 is useful to prevent oxidation and the like.

As is shown in FIGS. 1-6, 8, 9, 13 and 14, the mounting body 101 may be configured for a second fastening element 117 disposed in setting element hole 118 (FIGS. 3-6) that exerts compression or a clamping force through the setting element hole 118 against the accompanying ground wires, electronic wires, coax and cables, tubes, object and other items attached to attach and secure these when the second fastening element 117 is tightened against these wires and items. The hole setting element 118 can be smooth to accept a self-tapping fastener (e.g. self-tapping screw and bolt), or a threaded hole to accept a threaded fastener (e.g. screw and bolt), or other by other means such as, for example, using a staple or nail that exerts compression or a clamping force on the ground wire 120 to attach and hold in groove 115. The clamp assembly 100, as a result, is adapted to mount, secure, attach and hold securely devices including panels, snow rails and snow breaks, wind clamps, signs, HVAC equipment, conduit, satellite dishes, photovoltaic arrays or solar panels, clamps for components, accompanying ground wires, electronic wires, coax and cables, and other attachments to a standing seam 103 of a metal roof 119. Alternatively, it is contemplated that slot be dimensioned larger for water tubes, refrigerant lines, water solar panel, HVAC or other applications. Prior art attachment systems have disadvantages for receiving and secure a ground wire 120, cable 121 or the like as they used a separate wire or cable clamp 130, illustrated in FIG. 10, or simply tucked the wire or cable into the slot 102 for the raised seam. The present invention overcomes these disadvantages of added cost, manufacturing, installation complexity, and other disadvantages, to provide a groove 115 for securing wires 120, cables 121 and accompanying ground wires, coax and cables.

As is illustrated in FIG. 1 is an expanded view of the separate pieces of the clamp assembly 100. FIGS. 1-8, 13 and 14 illustrate the slot 102 of mounting body 101 body of the clamp assembly 100 formed on a lower portion 136 thereof to receive the standing seam 103 of a metal roof 119 of a building structure. The mounting body 101 has a generally longitudinal cross-section defined by the slot 102 which receives the ridge or standing seam 103 therein of a metal roof 119 panel or tile.

The mounting body 101 can be made from suitable metal, treated metal and metal alloys so as to protect from environmental conditions. For example, the mounting body 101 can be manufactured from extruded stock having the slot formed in the extrusion process such as, for example, 6061-T6 aluminum alloy. The slot 102 can be formed from the extrusion die in the extrusion process. Similarly, the groove 115 for the ground wire or electronic cable can be formed from the extrusion die in the extrusion process. The dimensions of the mounting body 101 can formed by cutting an extruded bar to a desired pre-determined length to form the mounting body 101 for a particular application.

Each of the holes, for example, the push-pin hole(s) 107, the fastener hole 111, the attachment hole 113, and the setting element hole 118 can be formed in the mounting body 101 by computer-numeric controlled (CNC) machines or other suitable manufacturing processes. The push-pin holes 107, the fastener hole 111, setting element hole 118 and the attachment hole 113 can be milled into the mounting block such as, for example, using CNC machines as desired, one or many process to drill, mill and/or tap with threads each hole 107, 111, 113 and 118. Holes 107 are left smooth so as to receive push pins 105 and so that pins 105 can be slidably urged against the standing seam 103 by tightening the fastening element 109 as it transmits force to the ends 106 of pins 105 by pressing on the washer 108. In certain cases, the attachment hole 113 can be tapped with threads for attachment systems such as the panel fastener assembly 126. In other self-tapping fastener applications, fastener hole 111 and attachment hole 113 are left smooth and untapped, or for certain fastening systems, where self-taping fasteners engage and form threads upon tightening in attachment hole 113 and/or the attachment hole 111 for the fastener locking assembly 117. Similarly setting element hole 118 for the fastener locking assembly 117 can be machined or milled and left smooth in the mounting body 101 for self-tapping fastener applications.

As is illustrated in FIGS. 1-8, the clamp assembly 100 is characterized by having a fastener assembly 104 comprising a plurality of pins 105 so that pins 105 can be slidably urged against the standing seam 103 by tightening the fastening element 109 as it transmits force to the ends 106 of pins 105 by pressing on the washer 108. The clamp assembly 100 constructed using pins 105 of the present invention provide a clamp using one or more pins to secure the mounting block to the standing seam. The pins advantageously hold the mounting body 101 to the standing seam 103 with an evenly distributed holding force. The pins 105 improve securing, holding, attachment and maintaining of the hold of the mounting block 101 to the standing seam 103 in thermal, vibration, seismic and in a number of other environmental conditions and ways, for example, without deforming or twisting the raised seam or roof under high winds or other environmental stresses. The pins 105 have ends 106 formed with a flat portion and taper. The pins 105 can be manufactured from 300 Series Stainless Steel and dimensioned 1.4 inches long×0.312 inches in diameter. The taper can be 0.07 inch with a resulting flattened portion of 0.17 inch. According to an embodiment of the present invention, all sharp edges of the pins 105 are deburred such as using a vibratory tumbler to remove all burrs and sharp edges that can damage the surface or coating of a standing seam 103, which accomplishes an object of the present invention to provide advantages of maintaining the integrity of the surface paint and other numerous problems for clamps using rotating screws as, for example, set screws can loosen, puncture, and scratch the Teflon, powder-coat and/or paint finish, cause cosmetic imperfections. The use of pins 105 in the clamp assembly 100, and mounting assembly 150, according to the present invention also eliminates manufacturing cost and steps such as, for example, threaded holes of the prior art as used in the block for set screws, thereby saving manufacturing time and money.

Each pin 105 is adapted to slide within cylindrical holes 107 extending through the body of the mounting body 101 to the slot 102. Holes 107 are smooth, unthreaded or otherwise untapped so as to slide within cylindrical holes 107. In operation, the pins 105 are urged against a standing seam 103 to a closed position by a washer 108 and a fastening element 109 securing, holding, attachment and maintaining of the hold of the one or more pins 105 in the mounting block 101 on the seam 103 with a locking portion 110 having advantages over the prior art in thermal, vibration, seismic and in a number of other environmental conditions and ways, for example, without deforming or twisting the standing seam 103 or metal roof 119.

As is illustrated in FIGS. 1-8, the washer 108 can be a flat washer or crush washer of suitable material, for example, can be manufactured from 300 Series Stainless Steel and dimensioned 1 inch outer diameter, ⅜ inch inner diameter with a thickness of approx. 0.005-0.075 inches. In an alternative embodiment, the fastening element 109 can be formed with an integral washer 108, or yet alternatively an integral washer 108 and locking portion 110. In operation the washer 108 should crush or deform under the torque and tightening of the fastening element 109. The washer 108 can deform on both surfaces: deforming or scoring the washer 108 by the operation of it rotating against the end of pin 106 thereby forming a unique groove or channel; and deforming on the other surface adjacent the locking portion 110 of the fastening element 109. In this manner, the present invention overcomes disadvantages of prior art systems where re-torquing and retightening of set screw fasteners was recommended and is required. The design of the fastener assembly 104 of the present invention has advantages of securing, holding, attachment and maintaining of the hold of the one or more pins 105 in the mounting block 101 on the seam 103 under thermal, seismic, and environmental conditions as described herein.

Figure 3:
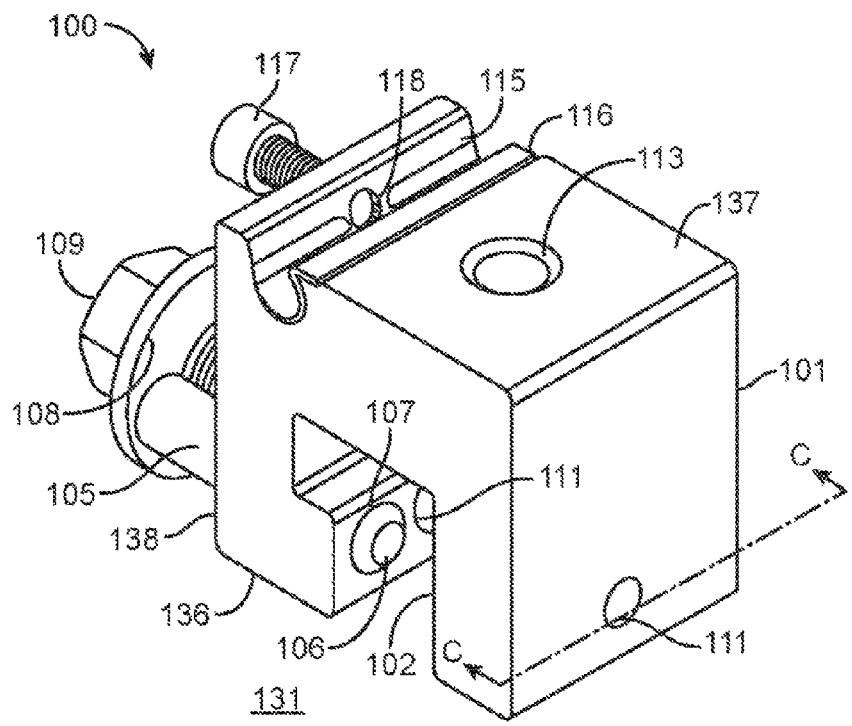
FIG. 3 illustrates the open position of the clamp of the present invention.
Figure 4:
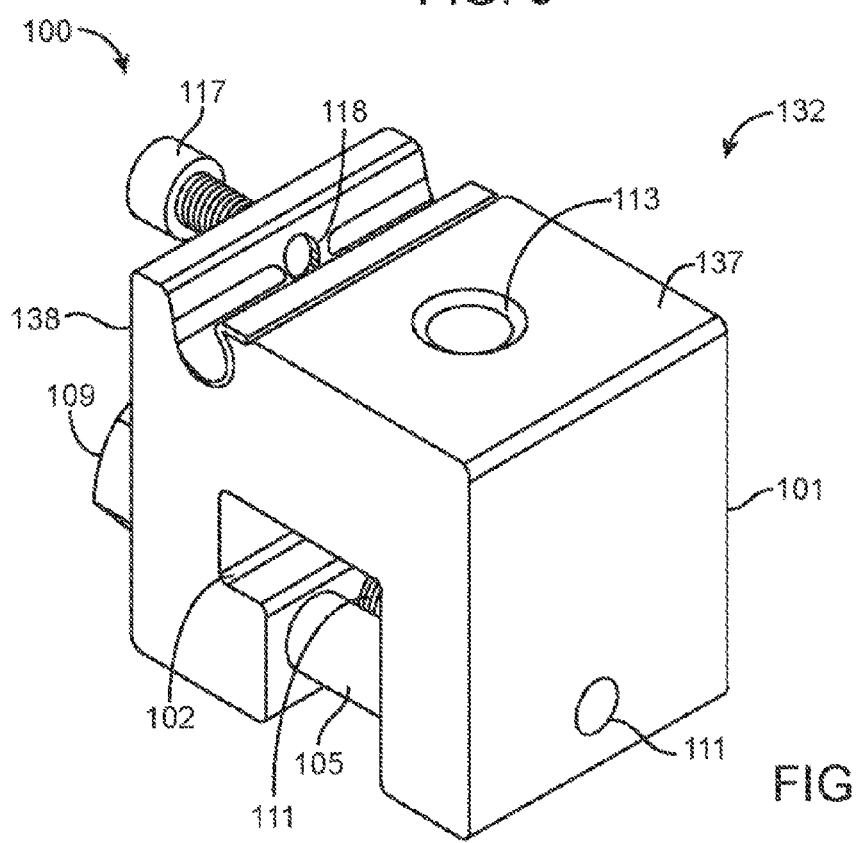
FIG. 4 illustrates the closed position of the clamp of the present invention.
Figure 7:
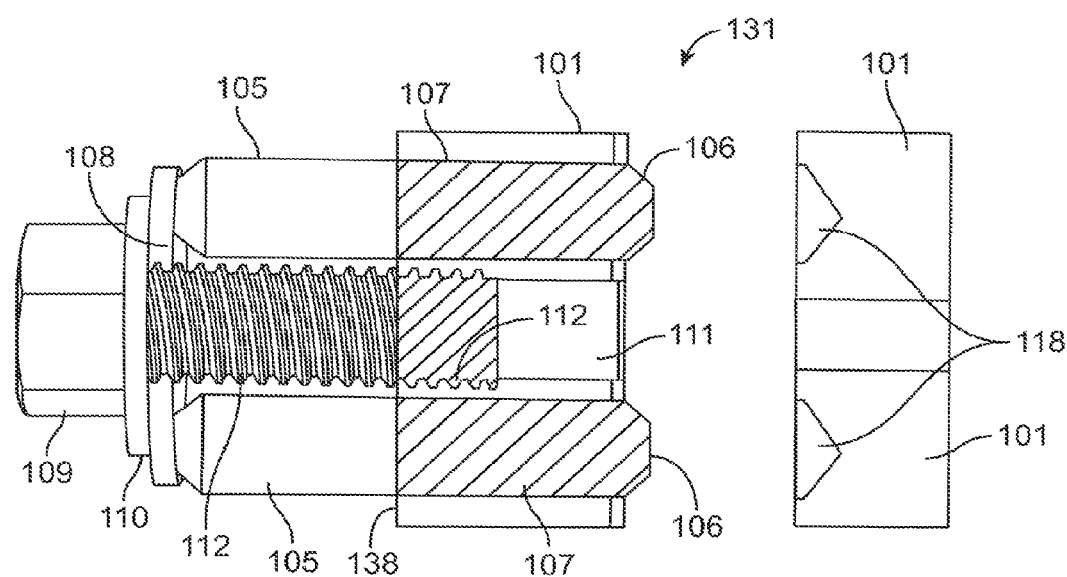
FIG. 7 illustrates a side view in the open position of the clamp along lines C-C of FIG. 3.
Figure 8:
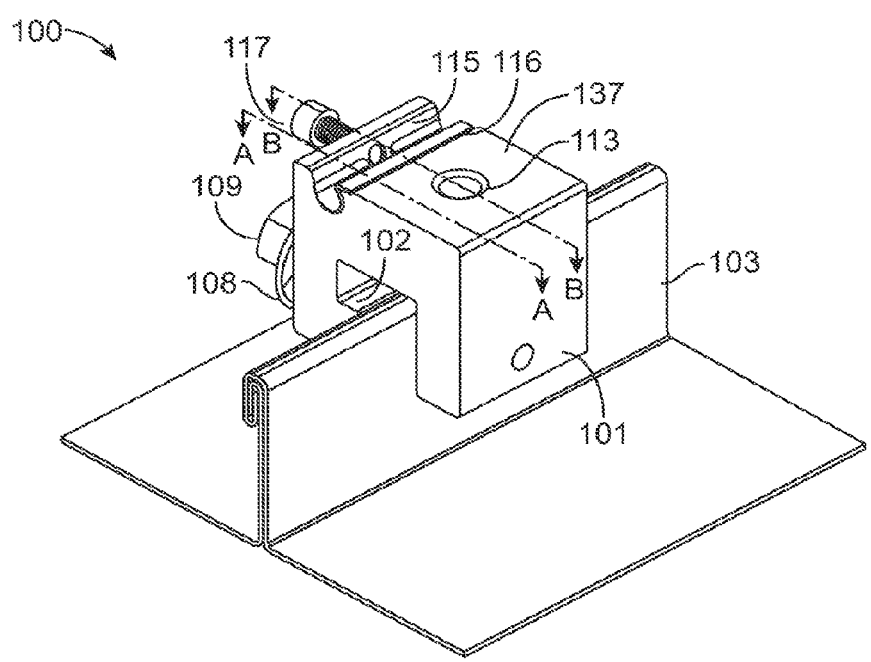
FIG. 8 illustrates the rear view from FIG. 2 of the clamp secured to a metal roof standing seam.

As is illustrated in FIGS. 1-8, the fastener 108 can be a flange head cap screw of suitable material, for example, can be manufactured from 300 Series Stainless Steel and dimensioned 10-32×0.5 inch long. The fastening element 109 has a locking portion 110 integrated on a surface adjacent washer 108 or a surface that otherwise engages with the washer 108. In operation, torquing or tightening the fastening element 109 pushes on the washer 108 and on ends of pin 106 the pins 105 crushes to deform the washer 108 under the torque and tightening of the fastening element 109, whereby the locking portion 110 digs into adjacent surface of the washer 108. The fastening element 109 operates to move the fastener assembly 104 between open position 131 (as is illustrated in FIGS. 3 and 7) and closed position 132, as is illustrated in FIGS. 2, 4-6, 8, and 13-14. The closed position is defined when the pins 105 are urged by the combined action of tightening the fastening element 109 against the washer 108, with the washer engaging the ends 106 of pins 105 so as to slide these along holes 107 towards the standing seam 103 and ultimately stopping as the clamp assembly 100 is securely fastened to the standing seam 103 as is illustrated in FIGS. 2, 5-6, 8, and 13-14.

Referring to FIGS. 1-6, 8 and 9, the pins 105 are disposed in holes 107 of the mounting body 101, on one end, between washer 108 and fastening element 109, and the slot 102 so as to hold the seam 103 in the slot 102 upon tightening the fastener assembly 104. In this manner, the present invention overcomes disadvantages of prior art systems where re-torquing and retightening was recommended and required and has advantages in a greater compression is translated and imparted by the pins 105 to create a stronger hold on the standing seam 103 under vibratory, wind and other environmental conditions so as to satisfy UL 2703 requirements (see UL (Underwriters Laboratories-www.ul.com)) for mounting and clamping devices to withstand most any environment and maintain electrical conductivity. Moreover, an efficient design of the fastener assembly 104 using the ends 106 of pins 105 to push against the standing seam 103 advantageously distributes the force to the seam 103 imparted by the pins 105, for example, dividing the force applied by the fastening element 109 by the number of pins 105. In FIGS. 5 and 6, for example, the force of a single fastening element 109 urged against the two pins 105 divides the force applied to the seam by 2. It is contemplated in alternative embodiments, that the fastening element 109 can urge multiple pins 105 such as, for example, three (3) pins 105 utilizing the washer 108 and fastening element 109. It also is contemplated in alternative embodiments, that the fastening element 109 can urge a bar across multiple pins 105 if the mounting body 101 is elongated so as to have more pins 105 engaging a greater area of the standing seam 103.

As is illustrated in FIGS. 1, 3-6, 8, 9, and 11-14, the present invention is configured with the attachment hole 113 on a top portion of the clamp assembly 110 in the mounting body 101 for attaching objects to the roof 119, for example, signs, walkways, satellite dishes, antennas, rooftop lighting, lightning protection systems, solar arrays, exhaust stack bracing, conduit, condensate lines, mechanical equipment and the like. The attachment hole 113 is centered on the mounting body 101 upper surface, and can be either tapped for untapped, that is, for example, to receive a threaded-metric M8 bolt, or inch bolt, a panel fastener assembly 126, or untapped for self-taping fasteners.

As is shown in FIGS. 11-14, the panel fastener assembly 126 includes a device fastener element 139, or 139*a* as shown in FIG. 13, adapted with threads to be inserted into the attachment hole 113 such as, for example, a nut 129 and threaded screw or bolt 139, or threaded screw or bolt 139*a* with a head of predetermined length and dimension such that the bolt with a head able to be tightened (e.g. by a wrench) replaces nut 129. The panel fastener assembly 126 can be configured with one or more gripping disks or solar caps 127, o-rings 128 for insulative and vibratory purposes, and a lock-nut 129. As is shown in FIGS. 13 and 14, the mounting assembly 150, once the threaded bolt or screw 139 is inserted into the attachment hole 113, a panel edge, for example, a device 160 (i.e. solar panel, etc.) is disposed between the gripping disks or solar caps 127 and the locking nut 129 is tightened. Alternatively, device 160 panel edges are disposed between the solar caps 127 and the bolt 139*a* is tightened. If a panel edge is not present on one side, an end support spacer 161 can be utilized.

Figure 15:
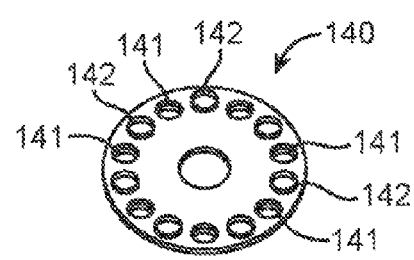
FIG. 15 illustrates schematic, perspective view of a grounding plate of a mounting assembly.

In an alternative embodiment of the present invention, as is illustrated in FIGS. 13, 14 and 15, the panel fastener assembly 126 can be configured with one or more grounding plates 140, o-rings 128 for insulative and vibratory purposes, and a lock-nut 129. As is illustrated in FIG. 15, each grounding plate 140 may be formed with alternating upward burred holes 141 and downward burred holes 142 configured to dig, burrow, plow, jab push and/or poke into the metal surface of the clamp assembly 101, thereby creating an effective ground. In this alternative embodiment, the grounding plate 140 can be added to the mounting assembly 150, whereby once the threaded bolt or screw 139 is inserted into the attachment hole 113, a panel edge, for example, a device 160 (i.e. solar panel, etc.) is disposed between solar caps 127, adding at least one grounding plate 140 between the lower solar cap 127 and the upper surface 137 of the mounting body 101 to create an effective ground, and then tightening the locking nut 129 is generally shown in FIGS. 13 and 14. Alternatively, device 160 panel edges are disposed between the solar caps 127, adding at least one grounding plate 140, and the bolt 139*a* is tightened. If a panel edge is not present on one side, an end support spacer 161 can be utilized.

Figure 16:
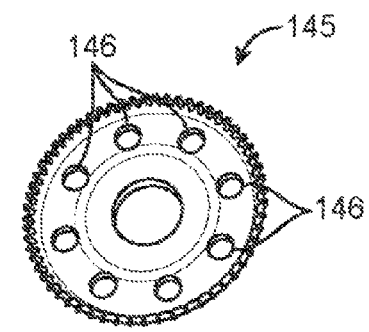
FIG. 16 illustrates schematic, perspective view of a grounding cap of a mounting assembly.

In an alternative embodiment of the present invention, as is illustrated in FIGS. 13, 14 and 16, the panel fastener assembly 126 can be configured with one or more grounding caps 145, o-rings 128 for insulative and vibratory purposes, and a lock-nut 129. Each grounding cap 145 may be formed with burred holes 146 configured to dig, burrow, plow, jab push and/or poke into the metal surface of the clamp assembly 101, thereby creating an effective ground. In this alternative embodiment, the grounding cap 145 can be substituted for one or more of the solar caps in the mounting assembly 150, whereby once the threaded bolt or screw 139 is inserted into the attachment hole 113, a panel edge, for example, a device 160 (i.e. solar panel, etc.) is disposed between a solar caps 127 and a grounding cap 145 disposed lower adjacent to the mounting body, or two grounding caps 145, so as to have at least one grounding cap 145 between the upper surface 137 of the mounting body 101 to create an effective ground, and then tightening the locking nut 129 is generally shown in FIGS. 13 and 14. Alternatively, device 160 panel edges are disposed between the solar caps 127, adding at least one grounding caps 145, and the bolt 139*a* is tightened. If a panel edge is not present on one side, an end support spacer 161 can be utilized.

Figure 9:
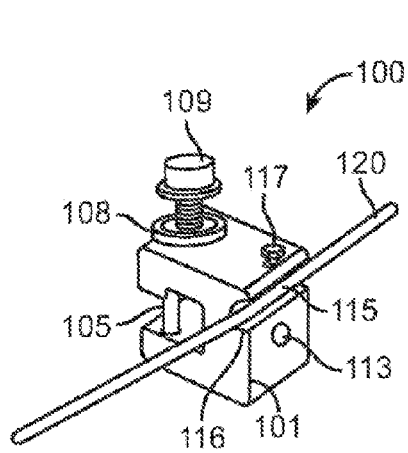
FIG. 9 illustrates a schematic view of the clamp assembly and a ground cable in accordance with an embodiment of the present invention.
Figure 10:
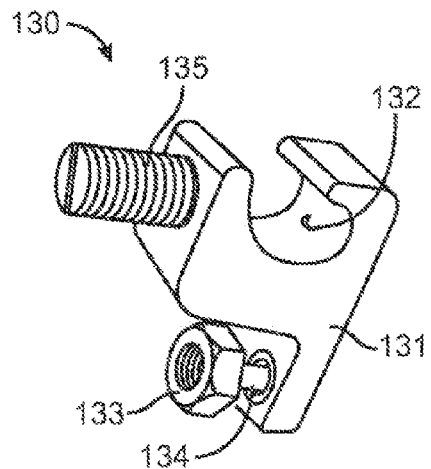
FIG. 10 illustrates a schematic view of a prior art ground cable attachment assembly.
Figure 11:
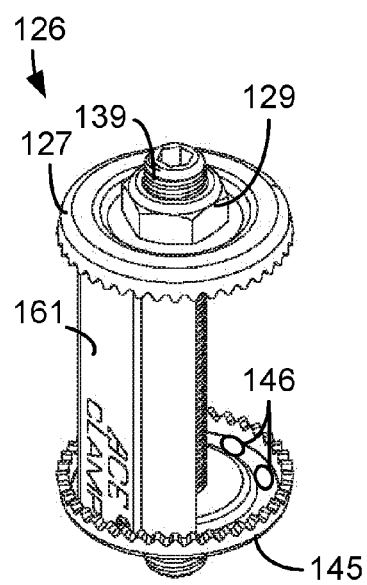
FIG. 11 illustrates a schematic view of a panel attachment assembly.
Figure 12:
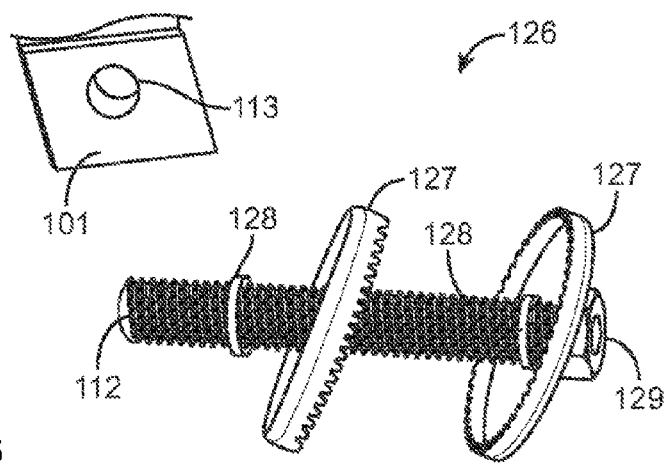
FIG. 12 illustrates a schematic view of a panel attachment assembly.

As is illustrated in FIGS. 1, 9 and 10, the wire assembly 114 is illustrated in an embodiment where a ground wire 120 is disposed in the groove 115, with the sleeve 116 there between to prevent corrosion, ionization, oxidation and the like, and is secured by the fastener locking assembly tightened through setting element hole 118. As above, the setting element hole 118 can be located on a side of the mounting body 101 and adjacent the groove 115 formed, for example, in an upper surface of the mounting body 101. The hole can be tapped or untapped, for example, threaded for a flange hex head screw of a dimension of ⅜-16×1" long and manufactured from 300 Series Stainless Steel.

Similarly the cable shield or sleeve 116 can be manufactured from 300 Series Stainless Steel. The prior art illustrated in FIG. 10, used a separate cable attachment 130 having a base 131, cable clot 132, fastener 133, lock washer 134 and set screw 135 that engaged the ground wire 120 or cable 121 when tightened. Disadvantages of the prior art cable attachment 130 are associated in its additional expense, cost of manufacture and during installation it is a separate smaller part that can be problematic. Disadvantages also include its small size and being non-integral. As a result, the integral wire assembly 114 of the present invention overcomes these and other disadvantages to provide an improved clamp assembly 100.

Referring to FIGS. 2, 5, 9, 13 and 14, the groove 115 is advantageous to locate and secure a ground wire 120, or other electronic cable for satellite dish, solar panel or the like, as shown in FIGS. 5, 6, 9, 13 and 14. For example, RG6 is the recommended coaxial cable for distributing signals from cable TV, satellite dish or from a roof-top antenna. As illustrated in FIG. 6, the coax cables 121 can have an insulating jacket 122, braided outer conductor 123, a dielectric medium 124, and a center conduit or conductor 123. Sleeve 116 operates to shield the signals of the center conduit 123 as well as to prevent corrosion, ionization, oxidation and the like. Sleeve 116 of the wire assembly 114 can be eliminated in situations where the insulating jacket is sufficient to overcome the enumerated and other disadvantages including corrosion, ionization, oxidation and the like.

As is illustrated in FIGS. 13 and 14, a mounting assembly 150 is described that may be used for securing, attaching, holding and electrically grounding a device 160 (e.g. a solar panel, Roof Mounted Displays, Satellite Dishes, Conduit and Piping, Snow-Retention System, HVAC, etc.) to a raised portion of a standing seam 103 of a metal roof, panel or tile 119 of building surface. The mounting assembly 150 comprises a clamp assembly 100 formed with a mounting body 101 of a general block shape, one or more pins 105 with each of the pins 105 having a substantially elongated cylindrical shape and configured to be received in one or more push-pin holes 107 formed in the mounting body 101, whereby the holes 107 extend substantially orthogonal relative to the slot 102 from a side surface 138 of the mounting body 101. The clamp assembly 100 includes a fastening element 109 adapted to be received in a fastener hole 111 formed adjacent the push-pin holes 107 and configured to secure, attach and hold the clamp assembly 100 to the standing seam 103 by forcing the pins 105 against the standing seam 103 when it is disposed in the slot 102.

The mounting assembly 150 further comprising a panel fastener assembly 126 configured to secure to attachment hole 113 that is centered on the upper surface 137 of mounting body 101 as is shown in FIGS. 11-14. The panel fastener assembly 126 includes a threaded screw or bolt 139 and a lock-nut adapted to be received by the threads of the attachment hole 113, or alternatively the threads 112 of a screw or bolt 139a. The panel fastener assembly 126 can be configured with one or more solar caps 127, o-rings 128 for insulative and vibratory purposes, and a lock-nut 129 so as to mount and secure the device 160 (i.e. solar panel, etc.) is disposed between the gripping disks or solar caps 127 and the locking nut 129 is tightened. The mounting assembly 150 further comprises securing the ground wire 120 (or cable 121 or other item) in the groove 115, which can have sleeve 116 to prevent oxidation, advantageous for grounding of electrical components and organization. Moreover, according to alternative embodiments of the present invention, as is illustrated in FIGS. 13, 14, 15 and 16, the mounting assembly 150 can be configured with one or more grounding plates 140 or grounding caps 145, as is described herein.

According to an embodiment of the present invention, the edges of the pin 105 may be chamfered or rounded if desired to reduce material requirements and enhance the appearance of the clamp assembly 100. Moreover, the dimensions of the clamp assembly 100 can be varied and may be selected to suit particular applications. For example, the depth, width, or shape of the slot 102 although universally selected, can be selected to closely match the profile of the ridges of a standing seam 103 and/or to accommodate for ridges 103 within a predefined range of widths. Furthermore, the body or mounting body 101 of the clamp assembly 100 can be dimensioned to allow any panel or other attachment to be positioned a desired distance above the surface of the metal roof 119. In the illustrated application, the mounting body 101 has a width, w, of approximately 1¼ inches; a height, h, of approximately 1¼ inches; and a length, 1, of about 2 inches. Moreover, the slot 102 is about ¾ inches deep (high) and ⅜ inches across (wide). These dimensions have been found suitable for an appropriate range of raised seam roofing applications.

In operation the present invention advantageously utilizes a distributed force to secure the clamp assembly 100 to the standing seam 103 applicant reduces gauging and breaching of the metallic or other coating of the metal roof 119 panel or tiles. Other disadvantages overcome by the fastener assembly 104 configuration of the present invention include
not using a set screw as set screws can loosen under high winds;
where the set screw point, when engaging the seam, relies on "digging in by the tip" and friction to maintain a hold;
as a rotating screw "digging in by the tip" scrapes off the paint, Teflon or other coating so as to leave a noticeable mark (should structures be later removed or if misplaced, the mistake of initial placement is tattooed to the roof for the remainder of its life; and
as a set screw does not use distributed force where the full torque and force of the fastener is applied by each screw, which configuration bends the raised seam under stress such as high winds causing damage to the metal roof 119.

In this manner, the present invention also overcomes disadvantages of prior art systems damaging the metal roof 119 under high winds, seismic vibration and other environmental conditions. The design of set screw fasteners has a disadvantage as it applies the full force of the torque through each fastener or set screw, thereby causing high force, deformity, gauging or breaching of surfaces, and bending standing seams under strains. The clamp assembly 100 utilizing the fastener assembly 104 of the present invention allows the pins 105 and ends 106. The rotation advantageously dissipates allow any rotational force to dissipate and not recoil, or as in prior art systems back out the threaded set screw. Moreover, another advantage is the action of the washer 108 crushing and deforming upon force being applied allows for a unique channel to each installation assisting in the holding power. Still yet another advantages is the action of the washer 108 crushing and deforming to the locking portion 110 of the fastening element 109 upon force being applied creating a unique crush imprint to each washer upon installation assisting in the holding power.

In this manner, the clamp assembly 100, and mounting assembly 150, of the present invention overcomes disadvantages of prior art systems where re-torquing and retightening of set screw fasteners was recommended and required. Conventional fasteners attaching the clamp(s) to the roof seam by set screws, threaded connections or the like have disadvantages in loosening over time due to vibrations, wind, seismic activity, and even may not meet design standards for Wind, Snow, Rain, and Seismic installations. Conventional mounting systems even recommend periodic torque and tightening to make the connection tighter. The nose portion of the screws can scratch or deform the finish of the metal roof. These scratches decrease the overall life, and possible guarantee from the manufacturer, to prevent oxidation and effective resistance to elements. According to certain advantages of the present invention, the multi-pin-based clamp assembly 100, and mounting assembly 150, it has been observed that,
a greater compression is translated and imparted by the pins 105 to create a stronger hold on the standing seam 103 under vibratory, wind and other environmental conditions according to UL 2703 requirements (see Underwriter Labs (www.ul.com)) for mounting and clamping devices to withstand most any environment and maintain electrical conductivity,
pins 105 that do less damage to the appearance and surface of the roof seam,
pins 105 convert torque to linear force and distribute to hold without slippage and/or need for re-torque,
a fastener element 109 using a crush lock washer sets and holds the pins 105 of the clamp assembly 100 in place by creating a spring compression load without re-tightening or re-torquing, and
the pins 105 of the clamp assembly 100 surpass recent standards of wind and seismic vibration.

The multi-pin-based clamp assembly 100 prevents torque back-out from wind flutter and seismic vibration, for example, using two stainless steel pins 105 to securely lock into standing seam 103 without scratching or damaging the panel's surface. The design of the fastener assembly 104 of the present invention advantageously provides a secure hold under thermal, vibratory and other environmental conditions due to spring compression loading and overcomes other problems in the prior art.

The clamp and mounting assemblies 100, 150 provide a strong clamp system solution that can uphold a metal roof manufacturers' warranty by minimizing surface damage and distributing the holding force so as to maintain the integrity of the roof and seam under environmental conditions. Several different types of coatings are used on metal panels: anti-rust, waterproofing, heat reflective. They are made of various materials such as epoxy and ceramic. Coatings are used as an untreated metal roof absorbs and retains heat which can cause high building envelope heat loads. Ceramic coatings can be applied on metal roof materials to add heat reflective characteristic, for example, paint with ceramic beads mixed in as an additive. Polymer coatings, for example, Kynar® (polyvinylidene fluoride (PVDF)) and Teflon® (polytetrafluoroethylene) and other synthetic fluorine-containing resins are used for nonstick coating. These normally have a lifetime product warranty and, in applications of a metal roof, should not normally require maintenance until the coating fails. Failure of the metal roof occurs when it is scratched or otherwise compromised. The clamp assembly 100, and mounting assembly 150, accomplishes this an object of the present invention to provide clamping to a raised metal seam 103 without penetrating the coating thereby maintaining the integrity of the metal roof 119, and any manufacturer's warranty, while providing an adaptable shape for a number of different functions such as mounting panels, cables and wires thereto. The slot 102 of the mounting block 101 is configured to fit over a raised seam 103, whereby the slot 103 has a universal open shape so as to mount over an endless variety of configurations of raised seams of metal roof 119, tiles and panels.

While certain configurations of structures have been illustrated for the purposes of presenting the basic structures of the present invention, one of ordinary skill in the art will appreciate that other variations are possible which would still fall within the scope of the appended claims. Additional advantages and modifications will readily occur to those skilled in the art. For example, the assembly can be made by injection molding, vacuum forming, and/or extrusion techniques. The clamp assembly 100 also can be useful for securing larger lines or tubes for water, refrigerant and HVAC systems in other applications such as, for example, to support such components and secure lines to a enlarged slot 114 to provide water or refrigerant from a reservoir to panels. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clamp assembly for securing a device to a raised portion of a surface, said clamp assembly comprising:
   a mounting body of a generally longitudinal cross-section comprising a slot for receiving said raised portion formed in a bottom surface of said mounting body, an upper surface and a side surface adjacent said slot on opposite sides of said mounting body;
   one or more pins, each of said one or more pins having a substantially elongated cylindrical shape, each of said one or more pins being received in one or more smooth non threaded push-pin holes formed in said side surface of said mounting body, said one or more push-pin holes extending from of said side surface of said mounting body to said slot; and
   a fastening element, said fastening element configured to operably connect to a fastener hole formed adjacent said one or more push-pin holes in said side surface of said mounting body, said fastening element has a head of a dimension configured to distribute a force of said fastening element against each of said one or more pins, said fastening element configured to secure said clamp assembly to said raised portion by forcing said one or more pins against said raised portion disposed in said slot.

2. The clamp assembly of claim 1, wherein said configured to distribute a force of said fastening element between each of said one or more pins toward said raised portion.

3. The clamp assembly of claim 2, wherein said head of said fastening element has a locking portion on a surface of said head adjacent said one or more pins.

4. The clamp assembly of claim 1, wherein said fastening element has a washer formed integral to said fastening element adjacent to said one or more pins.

5. The clamp assembly of claim 1, further including a washer disposed between said fastening element and said one or more pins, said washer configured to transmit an securing force of said fastening element to said one or more pins, thereby forcing said one or more pins against said raised portion in said slot.

6. The clamp assembly of claim 1, wherein said upper surface of said mounting body is configured with a groove for receiving a ground wire, cable and/or other item.

7. The clamp assembly of claim 3, wherein at least one of said side surfaces of said mounting body further includes a setting element hole adapted for a second fastening element.

8. The clamp assembly of claim 1, wherein said upper surface of said mounting body is configured with an attachment hole adapted to receive a third fastening element for securing the device to said upper surface.

9. A mounting assembly for securing a device to a raised portion of a surface, said mounting assembly comprising:
   a clamp assembly for detachably engaging said raised portion, said clamp assembly including a mounting body of a generally longitudinal cross-section comprising having a slot for receiving said raised portion formed in a bottom surface of said mounting body, a side surface adjacent said slot on opposite sides of said mounting body, and an attachment hole in an upper surface of said mounting body for securing the device thereon;
   one or more pins, each of said one or more pins having a substantially elongated cylindrical shape, each of said one or more pins being received in one or more smooth non threaded push-pin holes formed in said side surfaces of said mounting body, said one or more push-pin holes extending from said at least one of said side surface of said mounting body to said slot;
   a fastening element, said fastening element configured to operably connect in a fastener hole formed adjacent said one or more push-pin holes in said side surface of said mounting body, said fastening element configured to secure said clamp assembly configured to distribute a force of said fastening element to said one or more pins against said raised portion disposed in said slot; and
   a device fastening element configured to operably connect in said attachment hole for securing the device to said mounting assembly.

10. The mounting assembly of claim 9, wherein said attachment hole may be formed in said upper surface of said mounting assembly and/or in said side surface opposite said fastener hole for securing the device to said mounting assembly.

11. The mounting assembly of claim 10, wherein said fastening element has a locking element on a surface of a head of said device fastening element.

12. The mounting assembly of claim 9, wherein said fastening element has a washer formed integral to said fastening element configured to distribute a holding force of said fastening element to said one or more pins toward said raised portion.

13. The mounting assembly of claim 9, further including a washer disposed between said fastener and said one or more pins, said washer configured to transmit a securing force of the fastening element to said one or more pins, thereby forcing said one or more pins against said raised portion in said slot.

14. The mounting assembly of claim 9, wherein said upper surface of said mounting body is configured with a groove for receiving a ground wire, cable, hose and/or other item.

15. The mounting assembly of claim 14, further including a sleeve disposed within said groove on said upper surface of said mounting body of the clamp assembly, said sleeve for receiving said ground wire, cable, hose and/or other item to protect from oxidation of said mounting body of said clamp assembly.

16. The clamp assembly of claim 1, further comprising a bar wherein said fastening element is configured to transmit a securing force of the fastening element said bar to said one or more pins, thereby forcing said one or more pins against said raised portion in said slot.

17. The mounting assembly of claim 9, further comprising a bar wherein said fastening element is configured to transmit a securing force of the fastening element to said bar to said one or more pins, thereby forcing said one or more pins against said raised portion in said slot.

18. A clamp assembly for securing a device to a raised portion of a surface, said clamp assembly comprising:
   a mounting body of a generally longitudinal cross-section having a slot for receiving said raised portion formed in a bottom surface of said mounting body, a upper surface and a side surface adjacent said slot on opposite sides of said mounting body;
   one or more pins, each of said one or more pins having a substantially elongated cylindrical shape, each of said one or more pins being received in one or more push-pin holes formed in side surface, said one or more push-pin holes extending from said side surface of said mounting body to said slot; and
   a fastening element, said fastening element configured to operably connect to a fastener hole formed adjacent said one or more smooth non threaded push-pin holes in said side surface of said mounting body, said fastening element has a head configured to distribute a force of said fastening element against each of said one or more pins, said fastening element has a locking portion on a surface of said head adjacent said one or more pins, said fastening element configured to secure said clamp assembly to said raised portion by forcing said one or more pins against said raised portion disposed in said slot.

19. A clamp assembly for securing a device to a raised portion of a surface, said clamp assembly comprising:
   a mounting body of a generally longitudinal cross-section having a slot for receiving said raised portion formed in a bottom surface of said mounting body, a upper surface and a side surface adjacent said slot on opposite sides of said mounting body;
   one or more pins, each of said one or more pins having a substantially elongated cylindrical shape, each of said one or more pins being received in one or more push-pin holes formed in said side surface, said one or more push-pin holes extending from said side surface of said mounting body to said slot;
   a fastening element, said fastening element configured with a head and a threaded portion to operably connect to a fastener hole formed adjacent said one or more smooth non threaded push-pin holes in said side surface of said mounting body, and
   a washer disposed between said fastening element and said one or more pins, whereby said head is configured to distribute a force of said fastening element against said washer to said one or more pins against said raised portion in said slot.

* * * * *